(12) United States Patent
Du et al.

(10) Patent No.: US 11,485,878 B2
(45) Date of Patent: Nov. 1, 2022

(54) OPTICALLY CLEAR ADHESIVE FILM AND FLEXIBLE APPARATUS

(71) Applicant: BOE TECHNOLOGY GROUP CO., LTD., Beijing (CN)

(72) Inventors: Shuang Du, Beijing (CN); Paoming Tsai, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 13 days.

(21) Appl. No.: 17/076,466

(22) Filed: Oct. 21, 2020

(65) Prior Publication Data

US 2021/0189181 A1 Jun. 24, 2021

(30) Foreign Application Priority Data

Dec. 20, 2019 (CN) .......................... 201911324229.X

(51) Int. Cl.
| | | |
|---|---|---|
| *C09J 7/10* | (2018.01) | |
| *B32B 7/12* | (2006.01) | |
| *B32B 27/30* | (2006.01) | |
| *H01L 27/32* | (2006.01) | |
| *H01L 51/52* | (2006.01) | |

(Continued)

(52) U.S. Cl.
CPC ................. *C09J 7/10* (2018.01); *B32B 7/12* (2013.01); *B32B 27/308* (2013.01); *H01L 27/323* (2013.01); *H01L 51/5293* (2013.01); *B32B 2307/732* (2013.01); *B32B 2457/206* (2013.01); *C09J 2203/326* (2013.01); *C09J 2301/208* (2020.08); *C09J 2433/00* (2013.01); *G06F 3/0446* (2019.05); *G06F 3/04164* (2019.05); *G06F 2203/04102* (2013.01); *G06F 2203/04111* (2013.01)

(58) Field of Classification Search
CPC ............... H01L 27/323; H01L 51/5293; H01L 51/5237; G09G 3/3208; C09J 7/10; C09J 2203/326; C09J 2203/318; C09J 2301/312; C09J 2301/1242; C09J 2301/208; C09J 2433/00; B32B 7/12; B32B 27/308; B32B 27/12; B32B 2457/206; B32B 2307/732; G06F 3/0446; G06F 3/0412; G06F 3/04164; G06F 2203/04102; G06F 2203/04111
USPC .......................................... 345/76, 173, 174
See application file for complete search history.

(56) References Cited

U.S. PATENT DOCUMENTS

| | | | |
|---|---|---|---|
| 11,008,484 B1 * | 5/2021 | Du | ............................ C09J 7/10 |
| 2017/0194411 A1 * | 7/2017 | Park | ..................... H01L 51/5253 |

(Continued)

FOREIGN PATENT DOCUMENTS

| | | | | |
|---|---|---|---|---|
| CN | 106715624 A | | 5/2017 | |
| CN | 109135593 A | * | 1/2019 | ............. C09J 11/08 |

OTHER PUBLICATIONS

Office Action dated May 21, 2021 from corresponding CN Patent Application No. 201911324229.X, 15 pages.

*Primary Examiner* — Jimmy H Nguyen

(74) *Attorney, Agent, or Firm* — Procopio, Cory, Hargreaves & Savitch, LLP

(57) ABSTRACT

An optically clear adhesive film includes at least one first adhesive layer and at least one second adhesive layer that are stacked. A modulus of each first adhesive layer is less than a modulus of each second adhesive layer, and a glass transition temperature of the first adhesive layer is less than a glass transition temperature of the second adhesive layer.

10 Claims, 8 Drawing Sheets

(51) Int. Cl.
*G06F 3/044* (2006.01)
*G06F 3/041* (2006.01)

(56) References Cited

U.S. PATENT DOCUMENTS

2017/0253771 A1 9/2017 Lee et al.
2019/0225845 A1* 7/2019 Lee ........................ C09J 133/10

* cited by examiner

OPTICALLY CLEAR ADHESIVE FILM AND FLEXIBLE APPARATUS

CROSS-REFERENCE TO RELATED APPLICATION

This application claims priority to Chinese Patent Application No. 201911324229. X, filed on Dec. 20, 2019, which is incorporated herein by reference in its entirety.

TECHNICAL FIELD

The present disclosure relates to the field of display technologies, and in particular, to an optically clear adhesive film and a flexible apparatus.

BACKGROUND

An optically clear adhesive (OCA) film is a double-sided adhesive tape made of OCA after curing, and has characteristics of colorless and transparent, high light transmission (over 90%) and high adhesive strength. The OCA film may bond adjacent components in a flexible apparatus.

SUMMARY

In one aspect, an optically clear adhesive film is provided. The optically clear adhesive film includes at least one first adhesive layer and at least one second adhesive layer that are stacked. A modulus of each first adhesive layer is less than a modulus of each second adhesive layer, and a glass transition temperature of the first adhesive layer is less than a glass transition temperature of the second adhesive layer.

In some embodiments, the at least one first adhesive layer includes at least two first adhesive layers. In the at least one second adhesive layer, one second adhesive layer is disposed between one of the at least two first adhesive layers and another one of the at least two first adhesive layers.

In some embodiments, the at least one second adhesive layer includes one second adhesive layer.

In some embodiments, the at least two first adhesive layers include at least three first adhesive layers, and the at least one second adhesive layer includes a plurality of second adhesive layers. Any two adjacent first adhesive layers are provided with one of the plurality of second adhesive layers therebetween. Two adhesive layers farthest apart in the optically clear adhesive film are both first adhesive layers.

In some embodiments, the at least two first adhesive layers include at least three first adhesive layers, and the at least one second adhesive layer includes a plurality of second adhesive layers. Any two adjacent first adhesive layers are provided with one of the plurality of second adhesive layers therebetween. Two adhesive layers farthest apart in the optically clear adhesive film are one first adhesive layer and one second adhesive layer.

In some embodiments, the glass transition temperature of the first adhesive layer is in a range from approximately minus 51° C. to approximately minus 81° C., and the glass transition temperature of the second adhesive layer is in a range from approximately 0° C. to approximately minus 20° C.

In some embodiments, the glass transition temperature of the second adhesive layer is at minus 10° C.

In some embodiments, a thickness of the first adhesive layer is in a range from approximately 2 μm to approximately 20 μm.

In some embodiments, a thickness of the second adhesive layer is in a range from approximately 20 μm to approximately 30 μm.

In some embodiments, the optically clear adhesive further includes a third adhesive layer. The at least one first adhesive layer includes one first adhesive layer, the at least one second adhesive layer includes one second adhesive layer disposed between the first adhesive layer and the third adhesive layer. A modulus of the third adhesive layer is greater than the modulus of the first adhesive layer and less than the modulus of the second adhesive layer, and a glass transition temperature of the third adhesive layer is greater than the glass transition temperature of the first adhesive layer and less than the glass transition temperature of the second adhesive layer.

In another aspect, a flexible apparatus is provided. The flexible apparatus includes a plurality of components that are stacked, and at least one optically clear adhesive film according to any one of the above embodiments. Two adjacent components in the plurality of components are bonded through one optically clear adhesive film therebetween.

In some embodiments, the plurality of components include a flexible display panel.

In some embodiments, the plurality of components further include a cover plate, and the two adjacent components are the flexible display panel and the cover plate.

In some embodiments, the plurality of components further include a polarizer and a cover plate, and the polarizer is disposed between the flexible display panel and the cover plate. The two adjacent components are the flexible display panel and the polarizer, or, the two adjacent components are the cover plate and the polarizer.

In some embodiments, the at least one optically clear adhesive film includes two optically clear adhesive films. The plurality of components further include a polarizer and a cover plate, and the polarizer is disposed between the flexible display panel and the cover plate. The two adjacent components are the flexible display panel and the polarizer. The cover plate and the polarizer are bonded through another optically clear adhesive film therebetween.

In some embodiments, the flexible display panel includes: a base, a plurality of light-emitting devices, a thin film encapsulation layer, and a touch structure that are stacked on the base in sequence. The touch structure is configured to perform a touch identification.

In some embodiments, the plurality of components further include a cover plate. The cover plate includes: a cover plate body and a touch structure located on a side of the cover plate body facing the flexible display panel. The touch structure is configured to perform a touch identification.

In some embodiments, the flexible display panel is an electroluminescent light-emitting diode display panel.

BRIEF DESCRIPTION OF THE DRAWINGS

In order to describe technical solutions of the present disclosure more clearly, accompanying drawings to be used in some embodiments of the present disclosure will be introduced briefly. However, the accompanying drawings to be described below are merely some embodiments of the present disclosure, and a person of ordinary skill in the art may obtain other drawings according to these drawings. In addition, the accompanying drawings to be described below may be regarded as schematic diagrams, and are not limitations on actual dimensions of products, actual processes of methods and so on that the embodiments of the present disclosure relate to.

DETAILED DESCRIPTION

Figure 1:
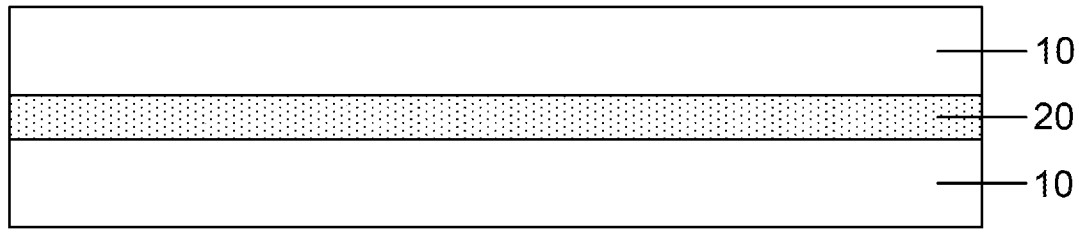
FIG. 1 is a schematic diagram of a flexible apparatus, in accordance with some embodiments.

Technical solutions in some embodiments of the present disclosure will be described clearly and completely in combination with accompanying drawings. However, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive, meaning "inclusive, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Below, terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. As used in the description and the claims, the singular forms "a", "an", and "the" may also include plural referents unless the content clearly dictates otherwise. In the description of the embodiments of the present disclosure, the term "a/the plurality of" means two or more unless otherwise specified.

It will be understood that when a layer or element is referred to as being "on" another layer or substrate, it may be directly on the layer or substrate, or one or more intervening layers or elements may also be present. Further, it will also be understood that when a layer or element is referred to as being "under" another layer or substrate, it may be directly under the layer or substrate, and one or more intervening layers or elements may also be present. Similarly, it will also be understood that when a layer or element is referred to as being "between" two layers or elements, it may be the only layer or element between the two layers or elements, or one or more intervening layers may also be present.

In some embodiments, "same layer and same material" refer to a layer structure formed by a same patterning process by using a same mask in which a film used for forming specific patterns is formed by using a same film-forming process. Depending on the specific patterns, the same patterning process may include exposure, development and etching processes, and the specific patterns in the formed layer structure may be continuous or discontinuous, and these specific patterns may also be at different heights or have different thicknesses. In some examples, two structures in the same layer and made of the same material may be located on the same surface or on different surfaces.

The expression "A and/or B" includes the following combinations of A and B: only A, only B, and a combination of A and B. The phrase "at least one of A, B, and C" has the same meaning as the phrase "at least one of A, B, or C", and both include the following combinations of A, B, and C: only A, only B, only C, a combination of A and B, a combination of A and C, a combination of B and C, and a combination of A, B, and C.

Some embodiments may be described using the expression "connected" along with its derivatives. For example, some embodiments may be described using the term "connected" to indicate that two or more elements are in direct physical contact or electrical contact with each other. However, the term "connected" may also mean that two or more elements are not in direct contact with each other, but yet still co-operate or interact with each other. The embodiments disclosed herein are not necessarily limited in this context.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In this Description, the term "thickness" means an average value of the thickness of each part of a layer or element, or means a general, overall thickness of the layer or element.

In addition, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, ±20%, ±10% or ±5% of the stated value.

Some embodiments of the present disclosure provide a flexible apparatus. As shown in FIG. 1, the flexible apparatus 1 includes a plurality of components 10 that are stacked and at least one optically clear adhesive (OCA) film 20. Two adjacent components 10 in the plurality of components 10 are bonded through one OCA film 20 therebetween. That is, the OCA film 20 is configured to bond the two adjacent components 10 together.

In some examples, some of the plurality of components 10 includes at least three components 10, and the at least one OCA film 20 includes a plurality of OCA films 20. Every two adjacent components 10 in the at least three components 10 are bonded together through a respective one of the plurality of OCA films 20.

In some other examples, the plurality of components 10 includes at least three components 10, and the at least one OCA film 20 includes a plurality of OCA films 20. Every two adjacent components 10 in the three components 10 are bonded together through a respective one of the plurality of OCA films 20.

An illustrative flexible apparatus generates a bending stress in a bending process. The bending stress includes a bending shear stress that causes a shear deformation to be generated on the flexible apparatus. The bending shear stress may damage the flexible apparatus. For example, a wrinkle, a delamination, a cracking, or the like may occur on one or more components in the flexible apparatus under the action of the bending shear stress. In addition, air bubbles may be formed when air enters a position where the wrinkle and the cracking occur, which affects the performance of the flexible apparatus. For another example, a shear slip may occur between two adjacent components in the flexible apparatus under the action of the bending shear stress, which causes a relative position of the adjacent components in the flexible apparatus to be changed.

The shear slip herein refers to a movement between the two adjacent components in a lateral direction, and the lateral direction is perpendicular to a direction in which the plurality of components are stacked in sequence.

In the flexible apparatus 1 provided in the embodiments of the present disclosure, two adjacent components 10 in at least part of components 10 of the plurality of components 10 are bonded together through one OCA film 20 therebetween. In a case where the flexible apparatus 1 generates the bending shear stress due to bending, the OCA film 20 may release at least part of the bending shear stress by generating a shear strain. In this way, on one hand, a shear strain due to the bending shear stress on the two adjacent components 10 may be minimized, which prevents a problem that the wrinkle, the delamination, the cracking, and/or the air bubbles occur on the two adjacent components 10. On another hand, the shear slip between the two adjacent components 10 under the action of the bending shear stress may also be avoided so as to prevent the lateral movement between the two adjacent components 10. Thus, the flexible apparatus 1 may be prevented from being damaged.

In addition to the bending shear stress that causes the shear strain to be generated on the flexible apparatus 1, the bending stress further includes a bending normal stress that causes a tensile strain and a compressive strain to be generated on the flexible apparatus 1. In the bending process of the flexible apparatus 1, on one hand, the OCA film 20 generates the shear strain, so as to release at least part of the bending shear stress. On another hand, the OCA film 20 is required to generate the tensile strain and the compressive strain, so as to release the self-generated bending normal stress.

Thus, in order to make the OCA film 20 release the bending shear stress as large as possible, and to prevent a damage to the OCA film 20 due to an excessive bending stress borne by itself under a joint action of the bending shear stress and the bending normal stress, the bending normal stress generated on the OCA film 20 may be reduced as much as possible.

The bending normal stress includes a tensile stress and a compressive stress. In the bending process of the flexible apparatus 1, the tensile stress is generated in a first portion proximate to an outer side, and the tensile strain occurs on the first portion as a result. The compressive stress is generated in a second portion proximate to an inner side, and the compressive strain occurs on the second portion as a result. In this case, on an interface from the first portion to the second portion, there will be a position where neither the tensile strain nor the compressive strain occurs, which is called as a neutral layer. There is no shear strain on the neutral layer, that is, no stress is generated in the neutral layer. Moreover, the closer a portion in the flexible apparatus 1 to the neutral layer, the smaller stress generated in the portion.

Therefore, in some examples, a thickness of the OCA film 20 may be set according to thicknesses of the two adjacent components 10 bonded through the OCA film 20, so that the neutral layer of the flexible apparatus 1 is in the OCA film 20. In this way, the bending normal stress generated on the OCA film 20 may be reduced as much as possible in the bending process of the flexible apparatus 1. Thus, the bending stress generated on the OCA film 20 may be reduced, so that the OCA film 20 is not easily damaged.

In some embodiments, one of the plurality of components 10 is a flexible display panel. The embodiments of the present disclosure do not limit the structure, shape, and size of other components 10.

In some examples, the flexible display panel is an electroluminescent light-emitting diode display panel, an electrophoretic display panel, or an electro-wetting display panel.

The electroluminescent light-emitting diode display panel may be, for example, one of an organic light-emitting diode (OLED) display panel, a micro light-emitting diode (Micro-LED) display panel, or a quantum dot light-emitting diode (QLED) display panel.

Figure 2:
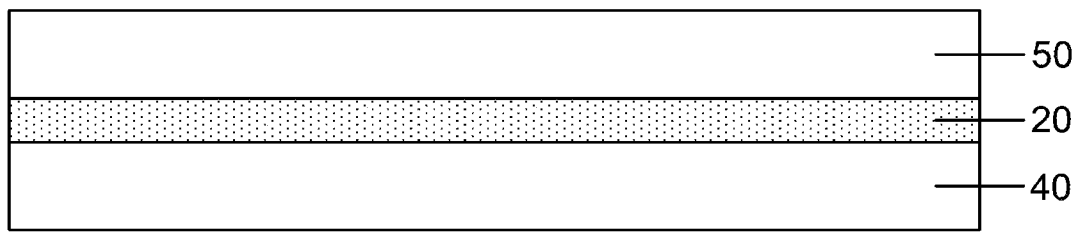
FIG. 2 is a schematic diagram of another flexible apparatus, in accordance with some embodiments.

In some examples, as shown in FIG. 2, two adjacent components 10 in the flexible apparatus 1 include a flexible display panel 40 and a cover plate 50. The OCA film 20 is disposed between the flexible display panel 40 and the cover plate 50. The OCA film 20 is configured to bond the flexible display panel 40 and the cover plate 50 together.

The cover plate 50 is made of a flexible material, for example, polymethyl methacrylate (PMMA). The flexible display panel 40 may be an electroluminescent light-emitting diode display panel.

Figure 3:
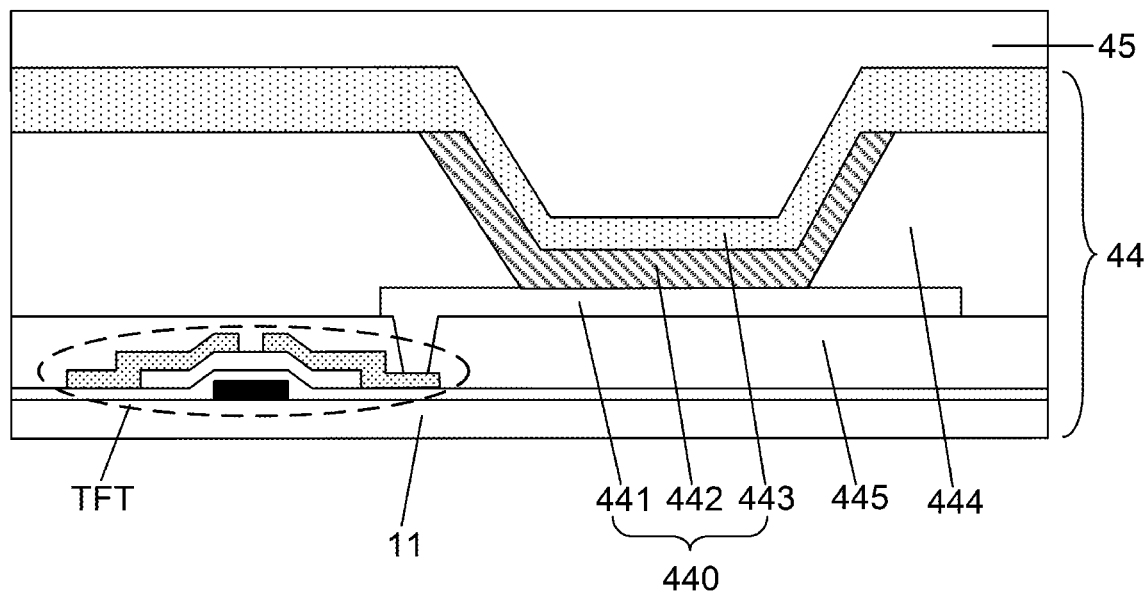
FIG. 3 is a schematic diagram of an electroluminescent light-emitting diode display panel, in accordance with some embodiments.

As shown in FIG. 3, the flexible display panel 40 includes a display substrate 44 and a thin film encapsulation (TFE) layer 45 that is configured to encapsulate the display substrate 44.

The display substrate 44 includes a base 11, a plurality of light-emitting devices 440 disposed on the base 11 (only one of the plurality of light-emitting devices 440 being shown in FIG. 3), and a plurality of pixel drive circuits. Each light-emitting device 440 and a respective one of the plurality of pixel drive circuits are located in one sub-pixel region. The pixel drive circuit includes a plurality of thin film transistors (TFTs). The light-emitting device 440 includes an anode 441, a light-emitting function layer 442, and a cathode 443. The anode 441 of the light-emitting device 440 is electrically connected to a source or a drain of one of the plurality of TFTs in the respective pixel drive circuit.

For example, the light-emitting function layer 442 includes a light-emitting layer (EL).

For another example, the light-emitting function layer 442 includes a light-emitting layer (EL), an electron transport layer (ETL) disposed between the EL and the cathode 443, and a hole transport layer (HTL) disposed between the EL and the anode 441. Moreover, the light-emitting function layer 442 further includes an electron injection layer (EIL) disposed between the ETL and the cathode 443, and/or a hole injection layer (HIL) disposed between the HTL and the anode 441.

For example, as shown in FIG. 3, the display substrate 44 further includes a pixel defining layer 444. The pixel defining layer 444 includes a plurality of openings therein. Each light-emitting device 440 is disposed in a respective one of the plurality of openings.

For example, as shown in FIG. 3, the display substrate 44 further includes a planarization layer 445 disposed between the pixel drive circuit and the anode 441.

The light-emitting device 440 may be a top-emission-type light-emitting device (that is, light emitted by the light-emitting device 440 exits from a side away from the base 11) or a bottom-emission-type light-emitting device (that is, light emitted by the light-emitting device 440 exits through the base 11) according to different light-emitting directions.

In the bottom-emission-type light-emitting device, in a case where the anode 441 is located on a side of the light-emitting function layer 442 facing the base 11, and the cathode 443 is located on a side of the light-emitting function layer 442 facing away from the base 11, the anode 441 is a transparent electrode and the cathode 443 is a reflective electrode.

For example, the anode 441 may be made of transparent metal oxide such as Indium Tin Oxide (ITO). The cathode 443 may be made of at least one of silver (Ag), aluminum (Al), magnesium (Mg), or the like.

In a top-emission-type light-emitting device, in a case where the anode 441 is located on a side of the light-emitting function layer 442 facing the base 11, and the cathode 443 is located on a side of the light-emitting function layer 442 facing away from the base 11, the anode 441 is a reflective electrode and the cathode 443 is a translucent electrode.

For example, the anode 441 includes a transparent sub-electrode and a non-transparent sub-electrode that are stacked along a thickness direction of the base 11. The transparent sub-electrode may be made of the transparent metal oxide, such as ITO. The non-transparent sub-electrode is located on a side of the transparent sub-electrode facing the base 11, and may be made of Ag, Al or Mg. The cathode 443 may be a thin silver electrode.

Figure 4:
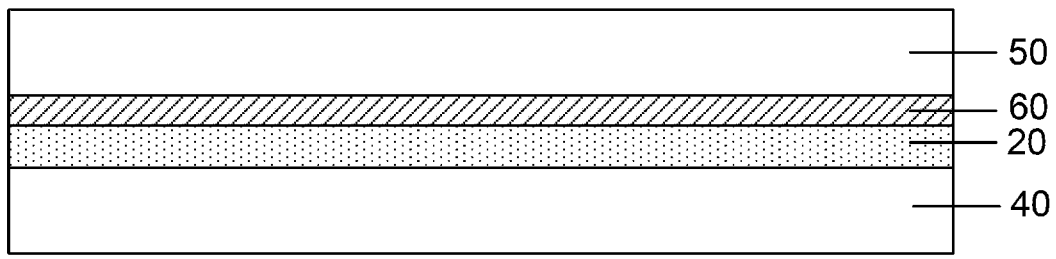
FIG. 4 is a schematic diagram showing an arrangement manner of an optically clear adhesive film in a flexible apparatus, in accordance with some embodiments.
Figure 5:
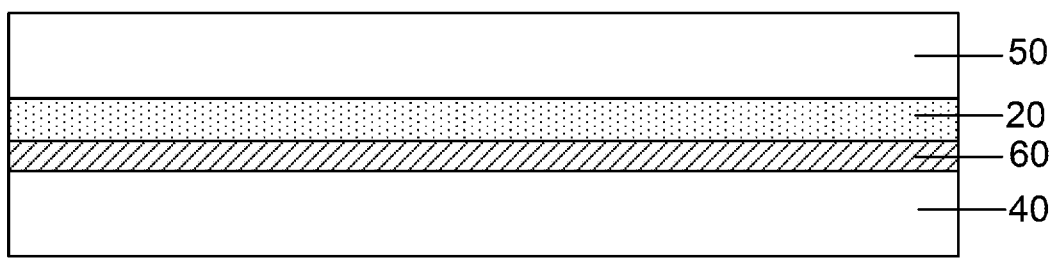
FIG. 5 is a schematic diagram showing another arrangement manner of an optically clear adhesive film in a flexible apparatus, in accordance with some embodiments.
Figure 6:
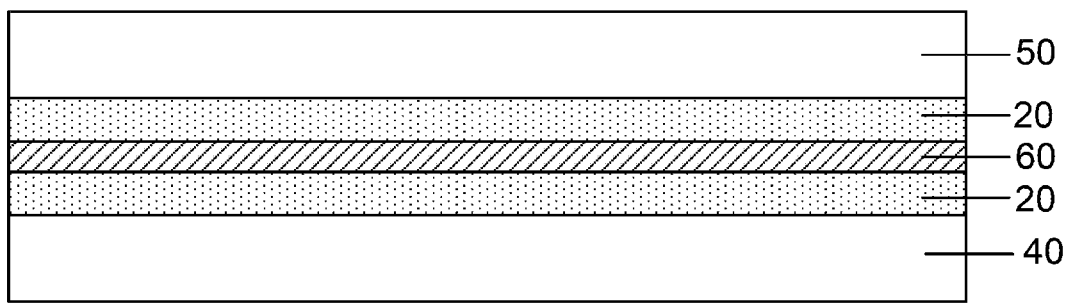
FIG. 6 is a schematic diagram showing yet another arrangement manner of an optically clear adhesive film in a flexible apparatus, in accordance with some embodiments.

In some embodiments, as shown in FIGS. 4 to 6, the plurality of components 10 further include a polarizer (POL) 60. The polarizer 60 is disposed between the flexible display panel 40 and the cover plate 50.

For example, as shown in FIG. 4, the flexible display panel 40 and the polarizer 60 are bonded together through one OCA film 20 therebetween.

For example, as shown in FIG. 5, the cover plate 50 and the polarizer 60 are bonded together through one OCA film 20 therebetween.

For example, as shown in FIG. 6, the flexible display panel 40 and the polarizer 60 are bonded together through one OCA film 20 therebetween, and the cover plate 50 and the polarizer 60 are bonded together through another OCA film 20 therebetween.

Figure 7:
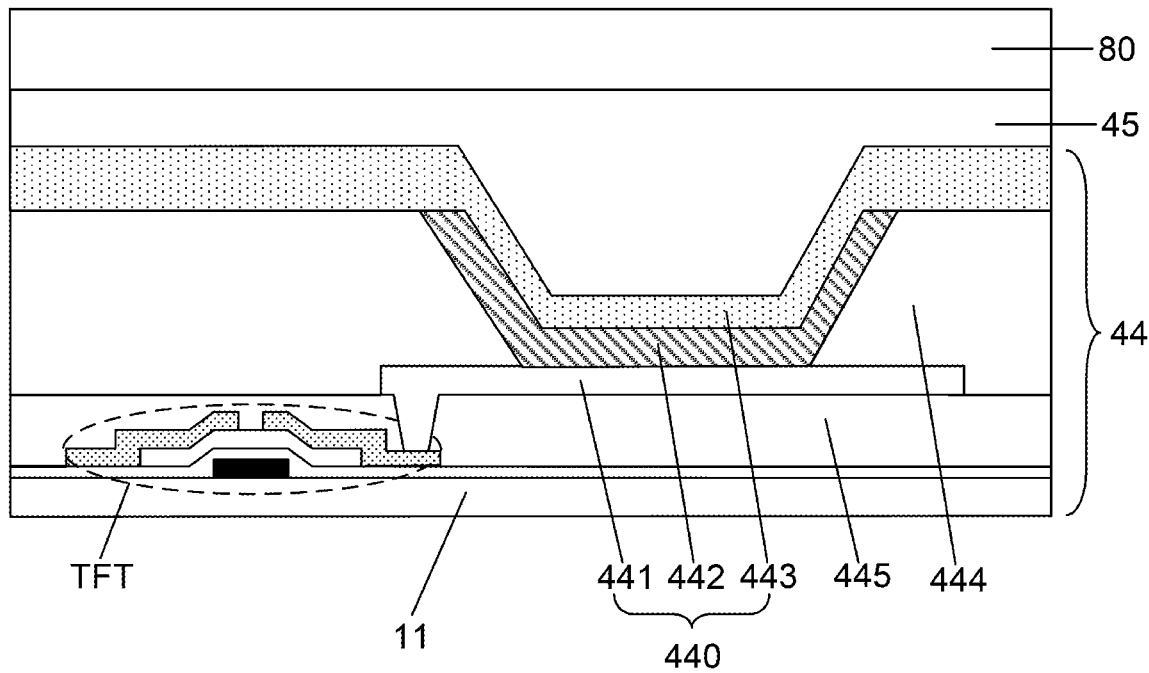
FIG. 7 is a schematic diagram of a flexible display panel, in accordance with some embodiments.

In some embodiments, the flexible display panel 40 further includes a touch structure. As shown in FIG. 7, the touch structure 80 may be, for example, located on a surface of the TFE layer 45 facing away from the base 11. The touch structure 80 is configured to perform a touch identification.

Figure 8:
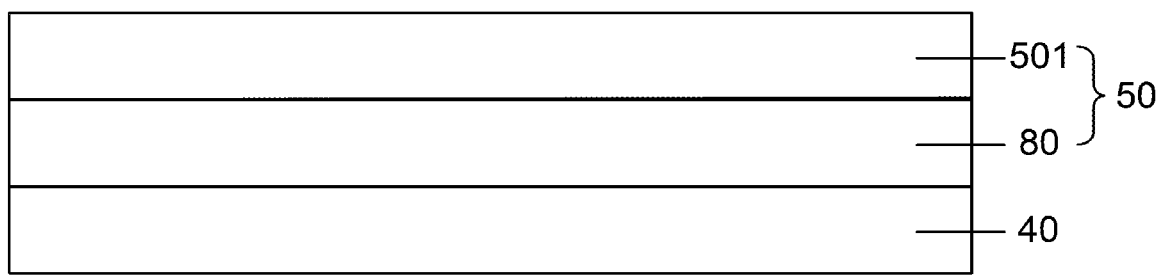
FIG. 8 is a schematic diagram of another flexible display panel and a cover plate, in accordance with some embodiments.

In some other embodiments, as shown in FIG. 8, the cover plate 50 includes a cover plate body 501 and a touch structure 80 located on a side of the cover plate body 501 facing the flexible display panel 40.

Figure 9:
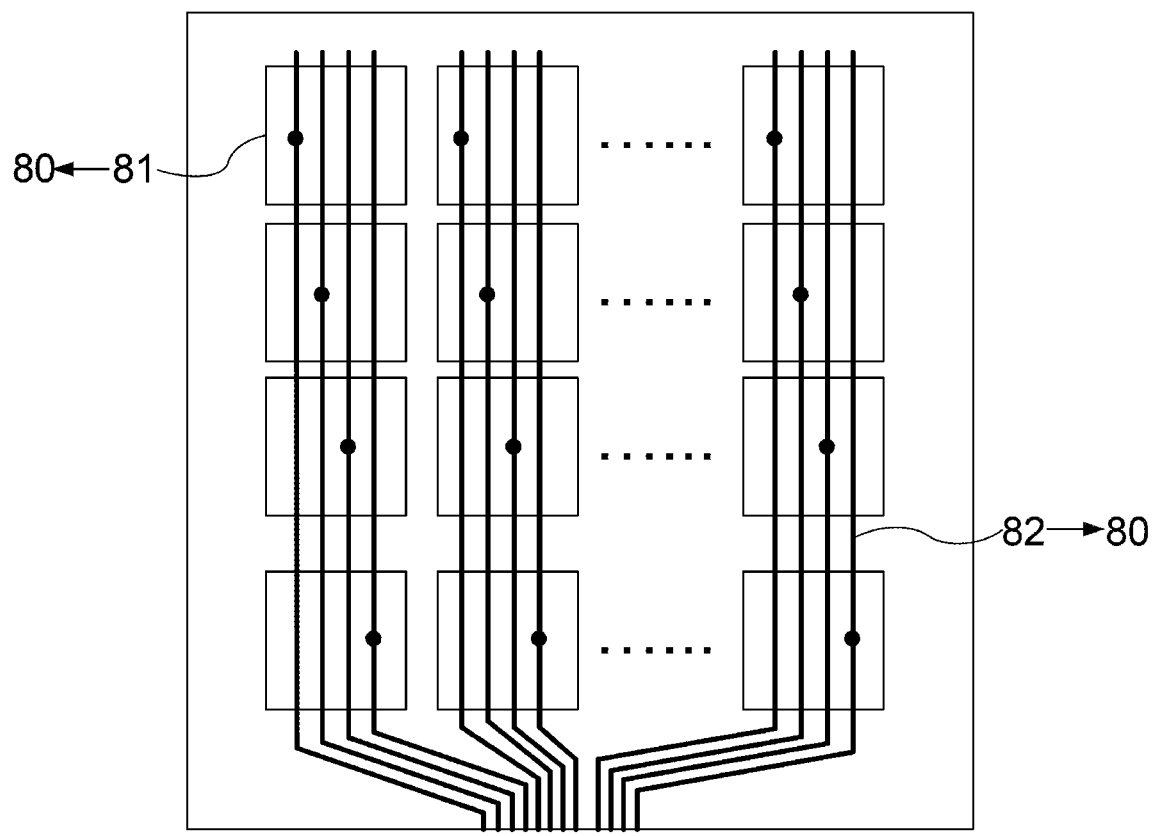
FIG. 9 is a schematic diagram of a touch structure, in accordance with some embodiments.
Figure 10:
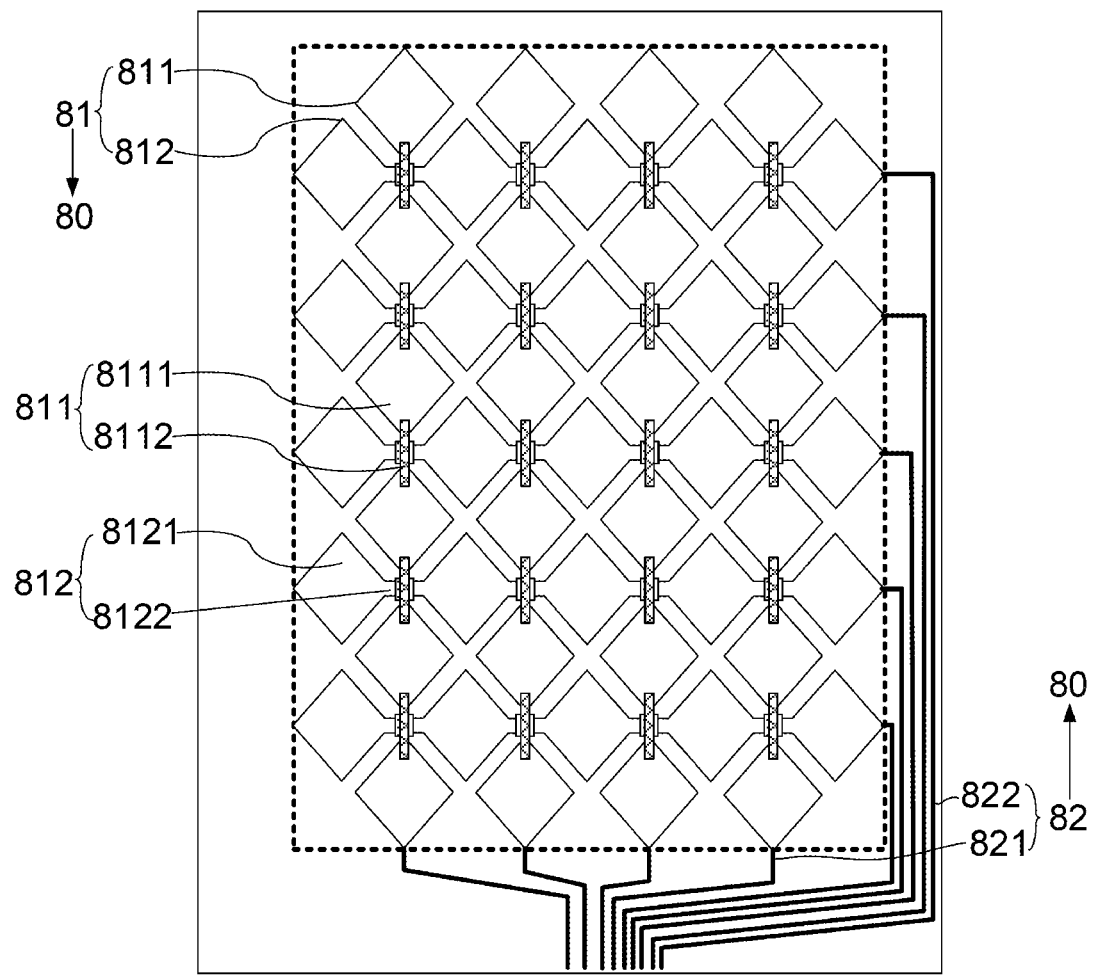
FIG. 10 is a schematic diagram of another touch structure, in accordance with some embodiments.
Figure 11:
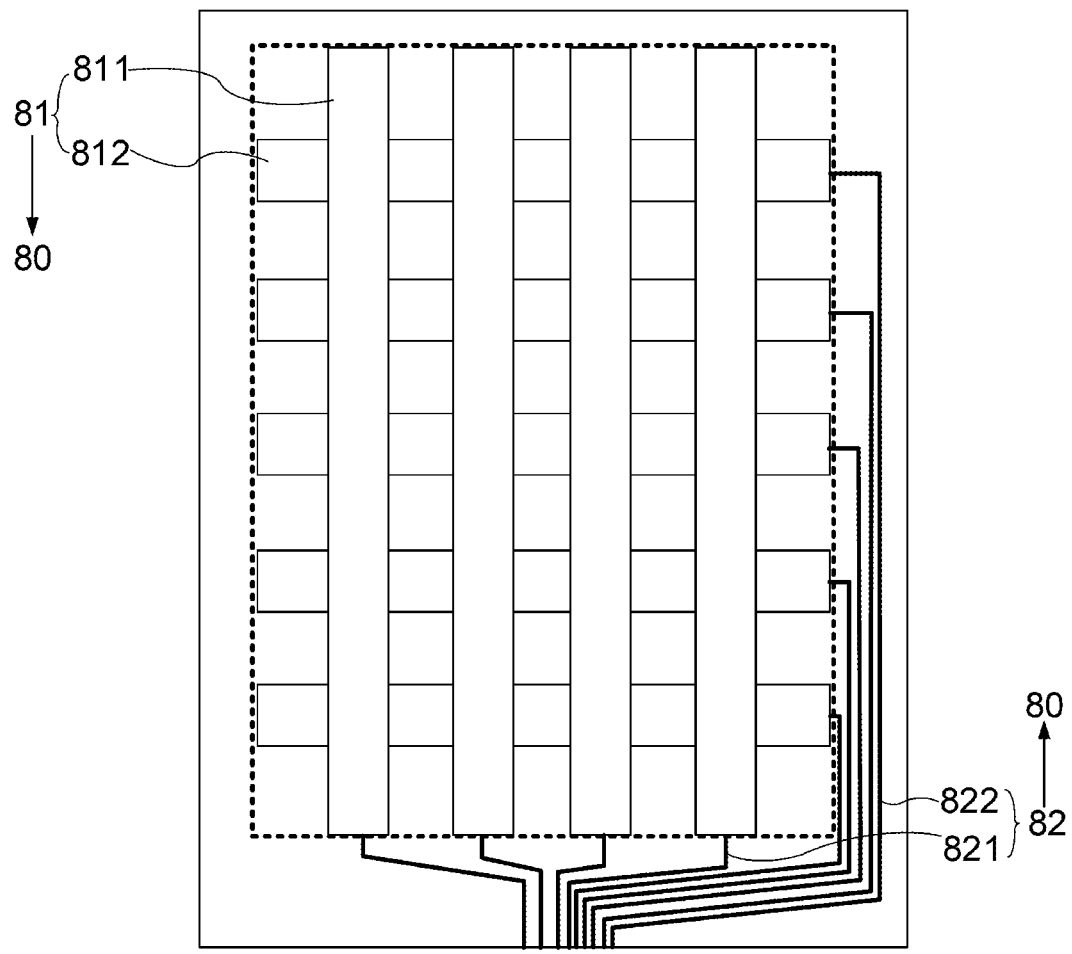
FIG. 11 is a schematic diagram of yet another touch structure, in accordance with some embodiments.
Figure 12:
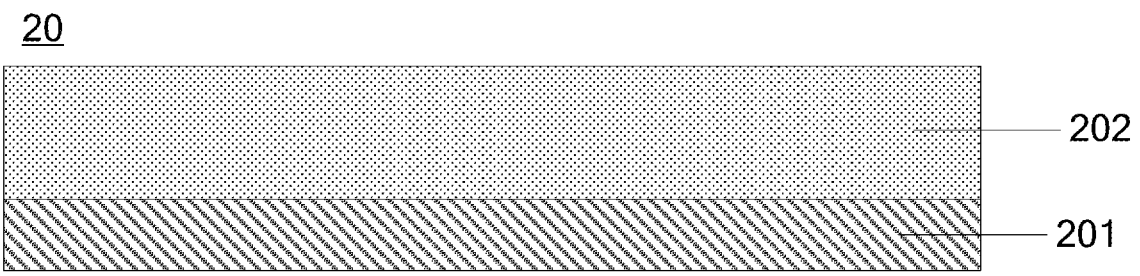
FIG. 12 is a schematic diagram of an optically clear adhesive film, in accordance with some embodiments.

In some embodiments, as shown in FIGS. 9 to 11, the touch structure 80 includes a plurality of touch electrodes 81 and a plurality of touch electrode wires 82. Each touch electrode 81 is electrically connected to at least one of the plurality of touch electrode wires 82.

In some examples, the touch structure 80 is a self-capacitance touch structure.

As shown in FIG. 9, the plurality of touch electrodes 81 are arranged in an array. The plurality of touch electrode wires 82 extend along a column direction (or a row direction), and each touch electrode wire 82 is electrically connected to one touch electrode 81.

In some other examples, the touch structure 80 is a mutual-capacitance touch structure.

As shown in FIGS. 10 and 11, the plurality of touch electrodes 81 include a plurality of first touch electrodes 811 and a plurality of second touch electrodes 812. The plurality of first touch electrodes 811 and the plurality of second touch electrodes 812 are arranged crosswise (e.g., perpendicularly) and insulated from each other. The plurality of touch electrode wires 82 include a plurality of first touch electrode wires 821 and a plurality of second touch electrode wires 822 that are insulated from each other. Each first touch electrode 811 is electrically connected to one first touch electrode wire 821, and each second touch electrode 812 is electrically connected to one second touch electrode wire 822.

For example, as shown in FIG. 10, the first touch electrode 811 includes a plurality of first touch sub-electrodes 8111 and a plurality of bridging portions 8112. Any two adjacent first touch sub-electrodes 8111 in a same first touch electrode 811 are electrically connected through one bridging portion 8112. The bridging portion 8112 is located in a region where the first touch electrode 811 and the second touch electrode 812 are arranged crosswise. The second touch electrode 812 includes a plurality of second touch sub-electrodes 8121 disposed in sequence and a plurality of connecting portions 8122. Any two adjacent second touch sub-electrodes 8121 in a same second touch electrode 812 are directly connected through one connecting portion 8122.

Shapes of the first touch sub-electrodes 8111 and the second touch sub-electrodes 8121 may be rectangles or rhombuses. The embodiments of the present disclosure do not limit the shapes of the first touch sub-electrodes 8111 and the second touch sub-electrodes 8121.

For another example, as shown in FIG. 11, an overall shape of the first touch electrode 81 and an overall shape of the second touch electrode 82 are rectangles.

The flexible apparatus 1 may further include a touch chip. The plurality of touch electrode wires 82 are electrically connected to the touch chip.

In the self-capacitance touch structure, the touch chip inputs a touch driving signal to the touch electrode 81 through the touch electrode wire 82, and then receives a touch sensing signal from the touch electrode 81 transmitted on the touch electrode wire 82 to determine a position of a touch point.

In the mutual-capacitance touch structure, as shown in FIGS. 10 and 11, the first touch electrode 811 may be a touch driving electrode, and the second touch electrode 812 may be a touch sensing electrode. The first touch electrode wire 821 is configured to transmit a touch driving signal to the first touch electrode 811, and the second touch electrode wire 822 is configured to receive a touch sensing signal from the second touch electrode 812. In this case, the touch chip inputs touch driving signals to the plurality of first touch electrodes 811 in sequence through the plurality of first touch electrode wires 821, and receives the touch sensing signal from the second touch electrode 812 transmitted on each second touch electrode wire 822. When no touch occurs, the touch sensing signal on each second touch electrode wire 822 is the same, that is, an initial signal. When a touch occurs, the touch sensing signal on at least one second touch electrode wire 822 is changed relative to the initial signal. Based on this, the touch chip determines the position of the touch point according to a position of the first touch electrode 811 to which the touch driving signal is inputted and a position of the second touch electrode 822 connected to the second touch electrode wire 812 on which the touch sensing signal is changed relative to the initial signal.

It will be understood that, in some other examples, the first touch electrode 811 may be a touch sensing electrode, and the second touch electrode 812 may be a touch driving electrode. In this case, the second touch electrode wire 822 is configured to transmit the touch driving signal to the second touch electrode 812, and the first touch electrode wire 821 is configured to receive the touch sensing signal from the first touch electrode 811.

As shown in FIGS. 12 to 16, some embodiments of the present disclosure provide an OCA film 20 may be applied in the above flexible apparatus 1. The OCA film 20 includes at least one first adhesive layer 201 and at least one second adhesive layer 202.

The at least one first adhesive layer 201 and the at least one second adhesive layer 202 are stacked along a thickness direction of the OCA film 20. A modulus of each first adhesive layer 201 is less than a modulus of each second adhesive layer 202, and a glass transition temperature of the first adhesive layer 201 is less than a glass transition temperature of the second adhesive layer 202.

Herein, a modulus of an adhesive layer refers to a storage modulus of a viscoelastic material from which the adhesive layer is made, which represents the ability of the material to store elastic deformation energy, and may reflect the elasticity of the material. Moreover, it will be understood that the relative magnitude of the modulus of the first adhesive layer 201 and the modulus of the second adhesive layer 202 are measured in the same or similar temperature range. The temperature range may be, for example, a normal use temperature range of a product including the OCA film 20, from approximately minus 80° C. to approximately 80° C. The glass transition temperature (Tg) is a temperature at which an amorphous polymer (including a non-crystalline part in a crystalline polymer) begins to transform from a glassy state to a high-elastic state or begins to transform from a high-elastic state to a glassy state.

Both the modulus and Tg of the adhesive layer may be measured by a dynamic mechanical analysis instrument, such as a dynamic thermomechanical analyzer (DMA).

It will be noted that in a case where a temperature of a material is lower than its Tg, the material is in a solid state. That is, a state of the material is similar to glass. The material hardly deforms under an action of an external force, and this state is the glassy state. In a case where the temperature of the material is higher than its viscous flow temperature, the material turns into a flowable viscous flow state. In a case where the temperature of the material is between the Tg and the viscous flow temperature, the material may deform under the action of the external force without any fluidity. This state is the high-elastic state.

A thickness of the OCA film is related to the Tg of the OCA film. In the related art, only one adhesive layer is disposed in the OCA film, and the performance of the OCA film depends entirely on the performance of this adhesive layer. Due to a strong flowability of an adhesive layer with a low Tg, it is difficult to form an OCA film with a large thickness. Therefore, an adhesive layer with a high Tg is selected as the adhesive layer applied in the OCA film. In this way, the formed OCA film has a large thickness, which ensures a high adhesiveness of the OCA film, and a firmness of two adjacent components bonded through the OCA film.

However, the larger the thickness of the OCA film is, the higher the modulus of the OCA film is. In this case, the smaller bending shear stress that the OCA film allows to be released is, and the larger the bending shear stress acting on two adjacent components bonded through the OCA film or acting between the two adjacent components is. Thus, a wrinkle, a delamination or a cracking may easily occur on components in the flexible apparatus, and/or the shear slip may easily occur between adjacent components in the flexible apparatus. When air enters the cracking position, air bubbles may be formed at the cracking position, which affects the performance of the flexible apparatus, and also reduces the adhesiveness of the OCA film.

In the embodiments of the present disclosure, the OCA film 20 includes a plurality of adhesive layers. In the plurality of adhesive layers, the modulus of the first adhesive layer 201 is less than the modulus of the second adhesive layer 202, and the Tg of the first adhesive layer 201 is less than the Tg of the second adhesive layer 202.

On one hand, since the modulus of the first adhesive layer 201 is small, the allowable shear strain in the OCA film 20 is relatively large, and the bending shear stress of the OCA film 20 allowed to be released is relatively large, so that the bending shear stress acting on two adjacent components 10 bonded through the OCA film 20 or acting between the two adjacent components 10 is small. In this way, the wrinkle, the delamination or the cracking on components 10 in the flexible apparatus 1 may be effectively prevented, and/or the shear slip between adjacent components 10 in the flexible apparatus 1 may be avoided. On another hand, since the Tg of the second adhesive layer 202 is greater than the Tg of the first adhesive layer 201, the high Tg ensures that the second adhesive layer 202 is capable of having a larger thickness. Therefore, the OCA film 20 may have a large thickness, which ensures a high adhesiveness of the OCA film 20, and a firmness of the two adjacent components 10 bonded through the OCA film 20.

Moreover, the OCA film in the related art is consisted of only one adhesive layer, and with only one Tg. The OCA film 20 in the embodiments of the present disclosure includes at least two adhesive layers with different glass transition temperatures. In this case, in the OCA film 20, the Tg of the second adhesive layer 202 is greater than the Tg of the first adhesive layer 201. In a case where an external ambient temperature reduces below the Tg of the second adhesive layer 202 but above the Tg of the first adhesive layer 201, the first adhesive layer 201 is still in the high-elastic state although the second adhesive layer 202 is in the glassy state. In this way, the first adhesive layer 201 can still release a part of the bending shear stress so as to enhance a low temperature withstanding capability of the OCA film 20.

Figure 13:
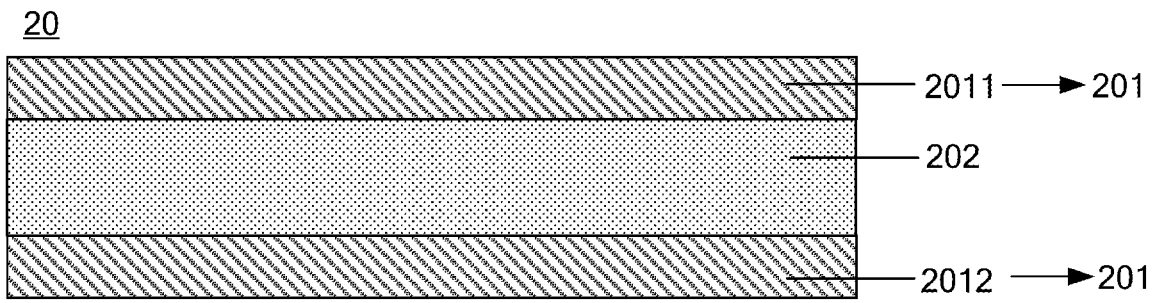
FIG. 13 is a schematic diagram of another optically clear adhesive film, in accordance with some embodiments.
Figure 14:
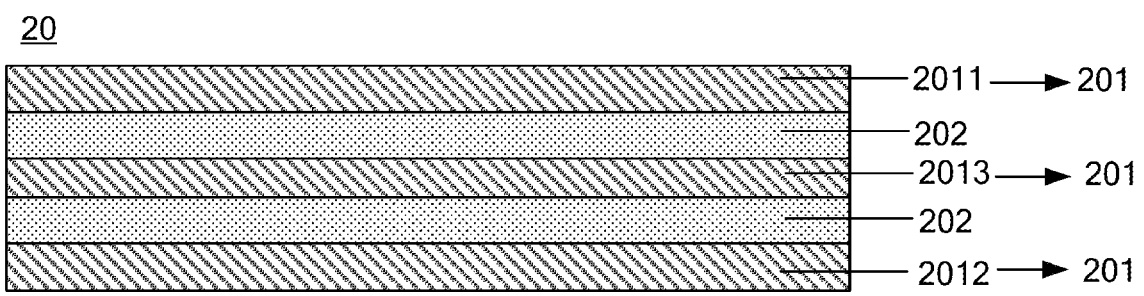
FIG. 14 is a schematic diagram of yet another optically clear adhesive film, in accordance with some embodiments.

In some embodiments, as shown in FIGS. 13 and 14, the at least one first adhesive layer 201 includes at least two first adhesive layers 201. One of the two first adhesive layers 201 is an upper adhesive layer 2011 and another one of the two first adhesive layers 201 is a lower adhesive layer 2012. In the at least one second adhesive layer 202, one second adhesive layer 202 is disposed between the upper adhesive layer 2011 and the lower adhesive layer 2012.

For example, as shown in FIG. 13, the at least one second adhesive layer 202 includes one second adhesive layer 202. The second adhesive layer 202 is disposed between the upper adhesive layer 2011 and the lower adhesive layer 2012.

For another example, as shown in FIG. 14, the at least one second adhesive layer 202 includes a plurality of second adhesive layers 202. The at least two first adhesive layers 201 further include at least one intermediate adhesive layer 2013 disposed between the upper adhesive layer 2011 and the lower adhesive layer 2012. Any two adjacent first adhesive layers 201 are provided with one of the plurality of second adhesive layers 202 therebetween. That is, in the OCA film 20, any two adjacent adhesive layers are one first adhesive layer 201 and one second adhesive layer 202. Moreover, two adhesive layers farthest apart in the OCA film 20 are two first adhesive layers 201. That is, in the OCA film 20, the two adhesive layers located on the outermost are both first adhesive layers 201.

Figure 15:
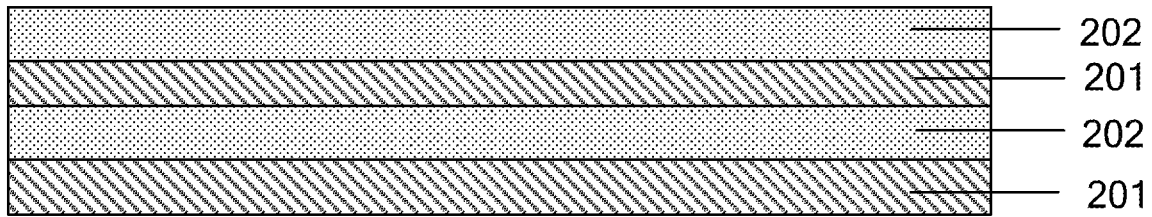
FIG. 15 is a schematic diagram of yet another optically clear adhesive film, in accordance with some embodiments.

In some embodiments, as shown in FIG. 15, the at least one first adhesive layer 201 includes a plurality of first adhesive layers 201, and the at least one second adhesive layer 202 includes a plurality of second adhesive layers 202. Any two adjacent first adhesive layers 201 are provided with one of the plurality of second adhesive layers 202 therebetween, and, two adhesive layers farthest apart in the OCA film 20 are one first adhesive layer 201 and one second adhesive layer 202. That is, in the OCA film 20, the two adhesive layers located on the outermost are one first adhesive layer 201 and one second adhesive layer 202.

Figure 16:
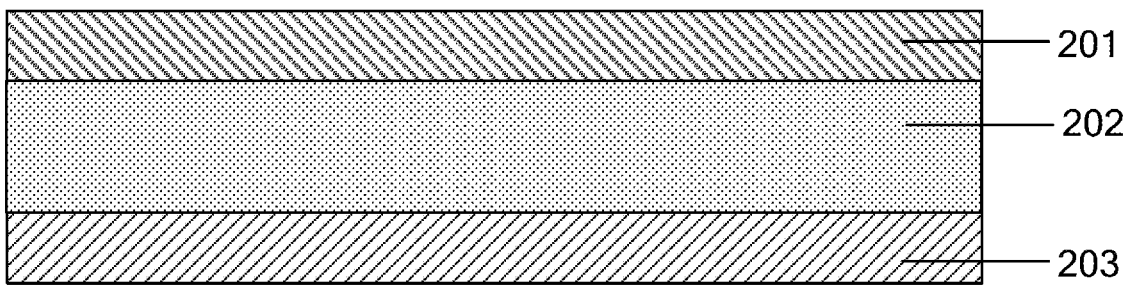
FIG. 16 is a schematic diagram of yet another optically clear adhesive film, in accordance with some embodiments.

In some embodiments, as shown in FIG. 16, the OCA film 20 further includes a third adhesive layer 203. A modulus of the third adhesive layer 203 is greater than the modulus of the first adhesive layer 201 and less than the modulus of the second adhesive layer 202. A glass transition temperature of the third adhesive layer 203 is greater than the Tg of the first adhesive layer 201 and less than the Tg of the second adhesive layer 202.

The at least one first adhesive layer 201 includes one first adhesive layer 201, and the at least one second adhesive layer 202 includes one second adhesive layer 202. The second adhesive layer 202 is disposed between the first adhesive layer 201 and the third adhesive layer 203.

In some examples, the Tg of the first adhesive layer 201 is in a range from approximately minus 51° C. to approximately minus 81° C. For example, the Tg of the first adhesive layer 201 may be at minus 51° C. (−51° C.), minus 60° C. (−60° C.), minus 70° C. (−70° C.), or minus 81° C. (−81° C.). The Tg of the second adhesive layer 202 is in a range from approximately 0° C. to approximately minus 20° C. For example, the Tg of the second adhesive layer 202 may be at 0° C., minus 10° C. (−10° C.), or minus 20° C. (−20° C.).

In this case, a thickness of the first adhesive layer 201 is in a range from approximately 2 µm to approximately 20 µm. For example, the thickness of the first adhesive layer 201 may be 2 µm, 5 µm, 10 µm, 15 µm, or 20 µm. A thickness of the second adhesive layer 202 is in a range from approximately 20 µm to approximately 30 µm. For example, the thickness of the second adhesive layer 202 may be 20 µm, 25 µm, or 30 µm.

For example, in a case where the at least one second adhesive layer 202 includes one second adhesive layer 202, and the second adhesive layer 202 is disposed between the upper adhesive layer 2011 and the lower adhesive layer 2012, the thickness of the OCA film 20 is in a range from approximately 24 µm to approximately 70 µm. For example, the thickness of the OCA film 20 may be 24 µm, 30 µm, 50 µm, 60 µm, or 70 µm.

In some examples, the Tg of the third adhesive layer 203 is in a range from approximately minus 21° C. to approximately minus 50° C. For example, the Tg of the third adhesive layer 203 may be at minus 21° C. (−21° C.), minus 30° C. (−30° C.), minus 40° C. (−40° C.), or minus 50° C. (−50° C.).

In some examples, the first adhesive layer 201, the second adhesive layer 202, and the third adhesive layer 203 may have the same thickness, for example, 20 µm.

For example, the first adhesive layer 201 and the third adhesive layer 203 are thermoset adhesive layers made of a thermoset adhesive. In some examples, the thermoset adhesive includes a prepolymer, a first initiator, and reactive monomers. The prepolymer may be, for example, carboxyl-terminated polyether (CTPE) modified epoxy acrylate resin. The first initiator may be, for example, cycloaliphatic epoxy resin, polyester triol, polyurethane diol, or sulfonium salt initiator. The reactive monomers may be, for example, acrylic ester active monomers.

The second adhesive layer 202 is a photo-curable adhesive layer made of a photo-curable adhesive. For example, the photo-curable adhesive includes a prepolymer, a second initiator, and reactive monomers. The corresponding descriptions about the prepolymer and the reactive monomers in the above-mentioned examples may also be used to illustrate the prepolymer and the reactive monomers, which will not be elaborated here again. The second initiator may be, for example, benzophenone and amine compounds, thioxanthone, camphorquinone or bis imidazole.

In some examples, the second adhesive 202 may be, for example, a UV (ultraviolet rays)-curable adhesive layer that can cure under irradiation of UV. In this case, the Tg of the second adhesive layer 202 is at minus 10° C.

It will be understood that the embodiments of the present disclosure do not limit the type of the second adhesive layer 202. The second adhesive layer 202 may be other types of photo-curable adhesive layers other than the UV-curable adhesive layer. For example, the second adhesive layer 202 may be an infrared photo-curable adhesive layer that can cure under irradiation of infrared light.

It will be understood that, the thickness and the number of layers of the first adhesive layer 201, and the thickness and the number of layers of the second adhesive layer 202 in the OCA film 20 may be rationally set according to the actual structure of the flexible apparatus 1.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An optically clear adhesive film, comprising:
   at least one first adhesive layer; and
   at least one second adhesive layer,
   wherein the at least one first adhesive layer and the at least one second adhesive layer are stacked,
   wherein a modulus of each first adhesive layer is less than a modulus of each second adhesive layer, and a glass transition temperature of the first adhesive layer is less than a glass transition temperature of the second adhesive layer,
   wherein the glass transition temperature of the first adhesive layer is in a range from approximately minus 51° C. to approximately minus 81° C., and the glass transition temperature of the second adhesive layer is in a range from approximately 0° C. to approximately minus 20° C.,
   wherein a thickness of the first adhesive layer is in a range from approximately 2 μm to approximately 15 μm, and a thickness of the second adhesive layer is in a range from approximately 20 μm to approximately 30 μm,
   wherein the optically clear adhesive film further comprises a third adhesive layer,
   wherein the at least one first adhesive layer includes one first adhesive layer, the at least one second adhesive layer includes one second adhesive layer disposed between the first adhesive layer and the third adhesive layer,
   wherein a modulus of the third adhesive layer is greater than the modulus of the first adhesive layer and less than the modulus of the second adhesive layer, and a glass transition temperature of the third adhesive layer is greater than the glass transition temperature of the first adhesive layer and less than the glass transition temperature of the second adhesive layer; and
   wherein the first adhesive layer and the third adhesive layer are thermoset adhesive layers made of a thermoset adhesive, and the second adhesive layer is a photo-curable adhesive layer made of a photo-curable adhesive.

2. The optically clear adhesive film according to claim 1, wherein the glass transition temperature of the second adhesive layer is at minus 10° C.

3. A flexible apparatus, comprising:
   a plurality of components that are stacked; and
   at least one optically clear adhesive film according to claim 1; wherein
   two adjacent components in the plurality of components are bonded through one optically clear adhesive film therebetween.

4. The flexible apparatus according to claim 3, wherein the plurality of components include a flexible display panel.

5. The flexible apparatus according to claim 4, wherein the plurality of components further include a cover plate, and the two adjacent components are the flexible display panel and the cover plate.

6. The flexible apparatus according to claim 4, wherein the plurality of components further include a polarizer and a cover plate, and the polarizer is disposed between the flexible display panel and the cover plate; and
   the two adjacent components are the flexible display panel and the polarizer, or, the two adjacent components are the cover plate and the polarizer.

7. The flexible apparatus according to claim 4, wherein the at least one optically clear adhesive film includes two optically clear adhesive films;
   the plurality of components further include a polarizer and a cover plate, and the polarizer is disposed between the flexible display panel and the cover plate;
   the two adjacent components are the flexible display panel and the polarizer; and
   the cover plate and the polarizer are bonded through another optically clear adhesive film therebetween.

8. The flexible apparatus according to claim 4, wherein the flexible display panel includes: a base, a plurality of light-emitting devices, a thin film encapsulation layer, and a touch structure that are stacked on the base in sequence, and the touch structure is configured to perform a touch identification.

9. The flexible apparatus according to claim 4, wherein the plurality of components further include a cover plate; the cover plate includes: a cover plate body and a touch structure located on a side of the cover plate body facing the flexible display panel, and the touch structure is configured to perform a touch identification.

10. The flexible apparatus according to claim 4, wherein the flexible display panel is an electroluminescent light-emitting diode display panel.

* * * * *